(12) United States Patent
Scott et al.

(10) Patent No.: US 12,278,603 B2
(45) Date of Patent: Apr. 15, 2025

(54) POWER AMPLIFIER SYSTEM

(71) Applicant: Qorvo US, Inc., Greensboro, NC (US)

(72) Inventors: Baker Scott, San Jose, CA (US);
Chong Woo, Fremont, CA (US);
George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 699 days.

(21) Appl. No.: 17/538,606

(22) Filed: Nov. 30, 2021

(65) Prior Publication Data
US 2023/0170858 A1 Jun. 1, 2023

(51) Int. Cl.
*H03F 3/20* (2006.01)
*H03F 1/02* (2006.01)
*H03F 3/195* (2006.01)
*H03F 3/24* (2006.01)

(52) U.S. Cl.
CPC .......... *H03F 3/245* (2013.01); *H03F 1/0227* (2013.01); *H03F 1/0288* (2013.01); *H03F 3/195* (2013.01); *H03F 2200/102* (2013.01); *H03F 2200/451* (2013.01)

(58) Field of Classification Search
CPC ...... H03F 3/245; H03F 1/0227; H03F 1/0288; H03F 3/195; H03F 2200/102; H03F 2200/451; H03F 3/213; H03F 1/0272
USPC .............................................. 330/124 R, 295
See application file for complete search history.

(56) References Cited

U.S. PATENT DOCUMENTS

| | | | |
|---|---|---|---|
| 6,625,238 B2 * | 9/2003 | Wieck | H03F 3/1935 375/349 |
| 8,552,803 B2 | 10/2013 | Sun et al. | |
| 10,320,345 B2 | 6/2019 | Sharma et al. | |
| 2003/0030495 A1 * | 2/2003 | Franca-Neto | H03F 3/45188 330/302 |
| 2010/0148871 A1 | 6/2010 | Lee et al. | |
| 2014/0159818 A1 * | 6/2014 | Jeon | H03F 1/0288 330/295 |
| 2020/0136561 A1 * | 4/2020 | Khlat | H03F 3/195 |

OTHER PUBLICATIONS

International Search Report and Written Opinion for International Patent Application No. PCT/US2022/050557, mailed Apr. 6, 2023, 17 pages.

\* cited by examiner

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

A power amplifier system having a power amplifier stage with dynamic bias circuitry is disclosed. Also included is bias control circuitry having a compression sensor having a sensor input coupled to a RF signal output and a sensor output, wherein the compression sensor is configured to generate a gain deviation signal in response to a sensed deviation from a flat gain profile of the power amplifier stage. Further included is a bias driver that is configured to drive dynamic bias circuitry to adjust bias to the power amplifier stage to maintain the flat gain profile in response to the gain deviation signal.

20 Claims, 12 Drawing Sheets

POWER AMPLIFIER SYSTEM

FIELD OF THE DISCLOSURE

The present disclosure relates to radio frequency amplification systems and methods operating the same.

BACKGROUND

Traditional power amplifiers are biased from a static bias circuit. The bias voltage and the supply current of the power amplifier are rectifying-up to positive values due to the class-AB/B operation of the stage. To achieve the needed linearity, the power amplifier needs to be biased at a relatively large quiescent current that results in poor efficiency during power-back-off operation. The power amplifier with static bias may also exhibit a soft compression region before entering a hard compression region caused by lack of supply voltage headroom. The soft compression region results in degraded adjacent channel leakage ratio linearity and thus lower maximum linear power for a given maximum supply current. To achieve the required linearity, the power amplifier needs to be backed down further in power, which degrades the efficiency of the power amplifier. In modern mobile applications there is a need for a new power amplifier system architecture that can provide simultaneously both higher linear power levels and higher efficiency.

SUMMARY

A power amplifier system having a power amplifier stage with dynamic bias circuitry is disclosed. Also included is bias control circuitry having a compression sensor having a sensor input coupled to the radio frequency signal output and a sensor output, wherein the compression sensor is configured to generate a gain deviation signal in response to a sensed deviation from a flat gain profile of the power amplifier stage. Further included is a bias driver that is configured to drive the dynamic bias circuitry to adjust bias to the power amplifier stage to maintain the flat gain profile in response to the gain deviation signal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
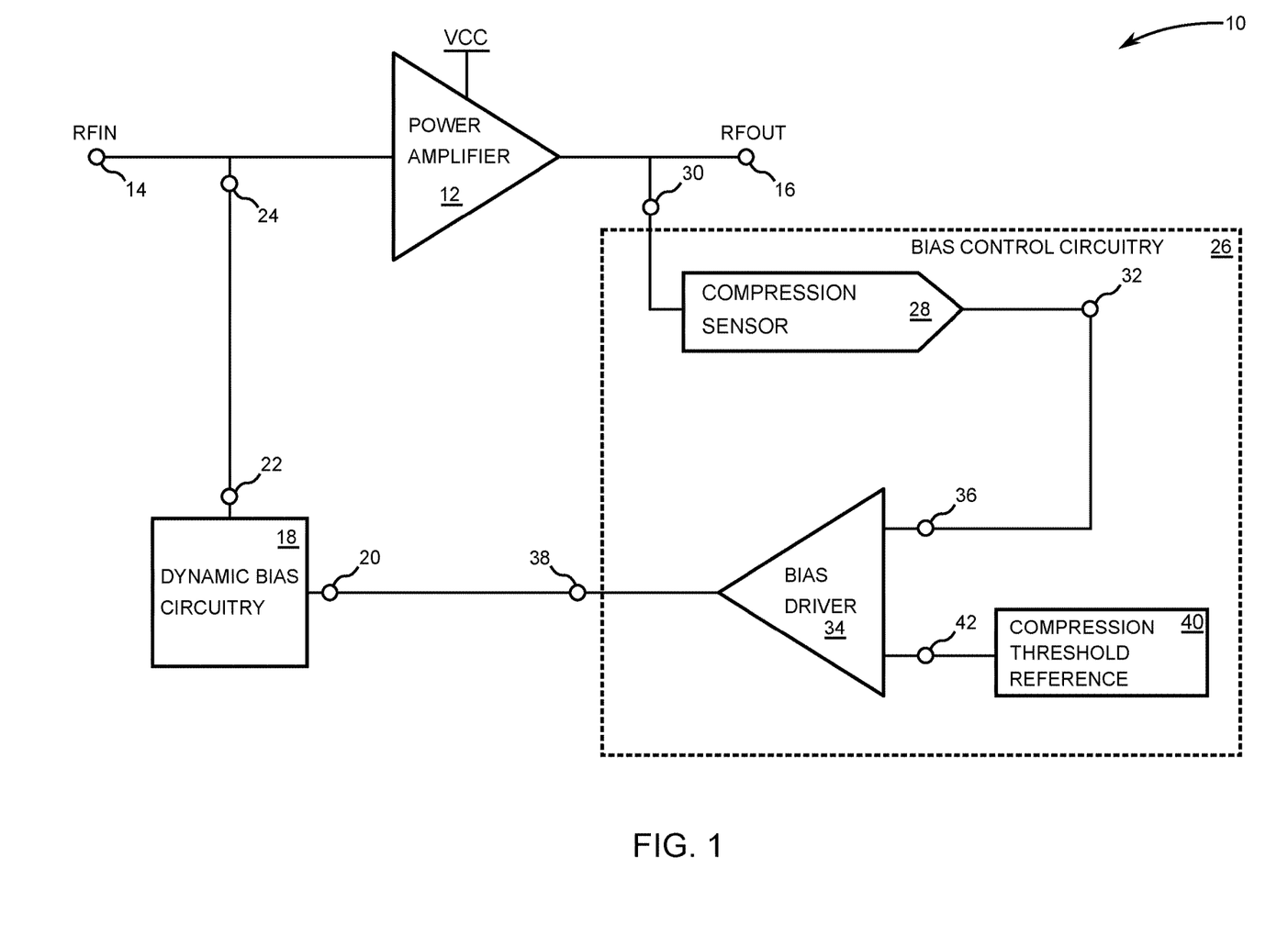
FIG. 1 is a block diagram of an exemplary embodiment of a power amplifier system that is structured in accordance with the present disclosure.

FIG. 1 is a block diagram of an exemplary embodiment of a power amplifier system 10 that is structured in accordance with the present disclosure. The power amplifier system 10 is of the fifth-generation/fourth-generation type (5G/4G) and includes a power amplifier stage 12 having a radio frequency (RF) signal input 14 and an RF signal output 16. Also included is dynamic bias circuitry 18 having a bias control input 20 and a bias output 22, wherein the bias output 22 is coupled to a bias input 24 of the power amplifier stage 12. The power amplifier stage 12 may be a single-ended amplifier or a differential amplifier.

Further included is bias control circuitry 26 having a compression sensor 28 with a sensor input 30 coupled to the RF signal output 16 and a sensor output 32, wherein the compression sensor 28 is configured to generate a gain deviation signal in response to a sensed deviation from a flat gain profile of the power amplifier stage 12. A bias driver 34 having a first driver input 36 coupled to the sensor output 32 and a driver output 38 coupled to the bias control input 20, wherein the bias driver 34 is configured to generate a bias adjust signal to drive the dynamic bias circuitry 18 to adjust bias of the power amplifier stage 12 to maintain the flat gain profile in response to the gain deviation signal.

The bias control circuitry 26 further includes a compression threshold reference 40 configured to generate a reference signal that scales the bias adjust signal that is received by a reference input 42 of the bias driver 34. In the exemplary embodiment of FIG. 1, the bias driver 34 is a comparator that is configured to compare the gain deviation signal to the reference signal and generate the bias adjust signal in proportion to a difference between the gain deviation signal and the reference signal. In some embodiments, the comparator is of the analog type and in other embodiments the comparator is of the digital type.

Figure 2:
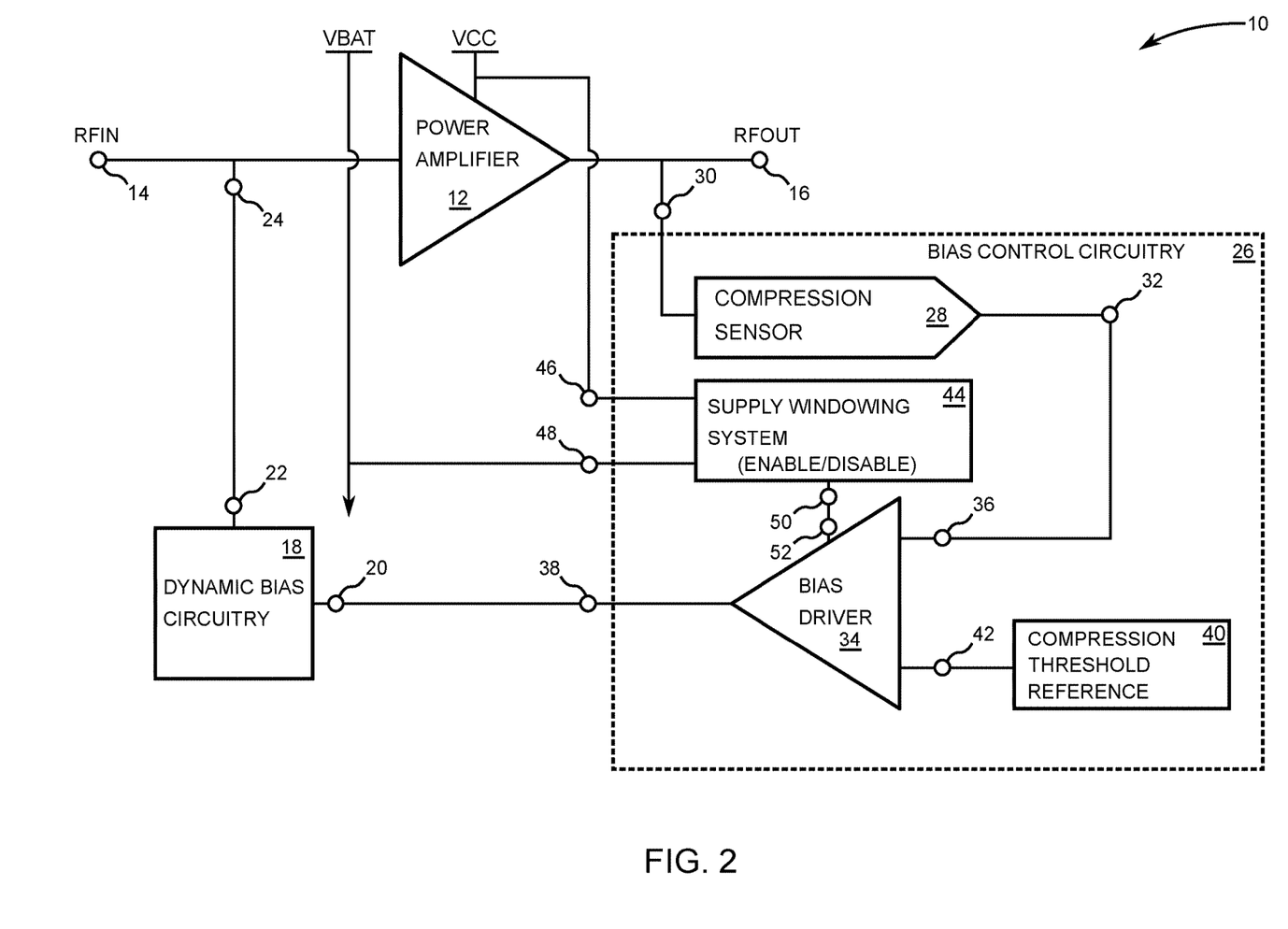
FIG. 2 is a block diagram of an embodiment of the power amplifier system that further includes supply windowing circuitry.

FIG. 2 is an embodiment of the power amplifier system 10 in which the bias control circuitry 26 further includes supply windowing circuitry 44 that is configured to enable the bias driver 34 when a supply level is above a first supply level or below a second higher supply level and to disable the bias driver 34 when the supply level is below the first supply level or above the second higher supply level. The supply windowing circuitry 44 has a high supply input 46, a low supply input 48 and an enable/disable output 50 coupled to an enable/disable input 52 of the bias driver 34.

Figure 3:
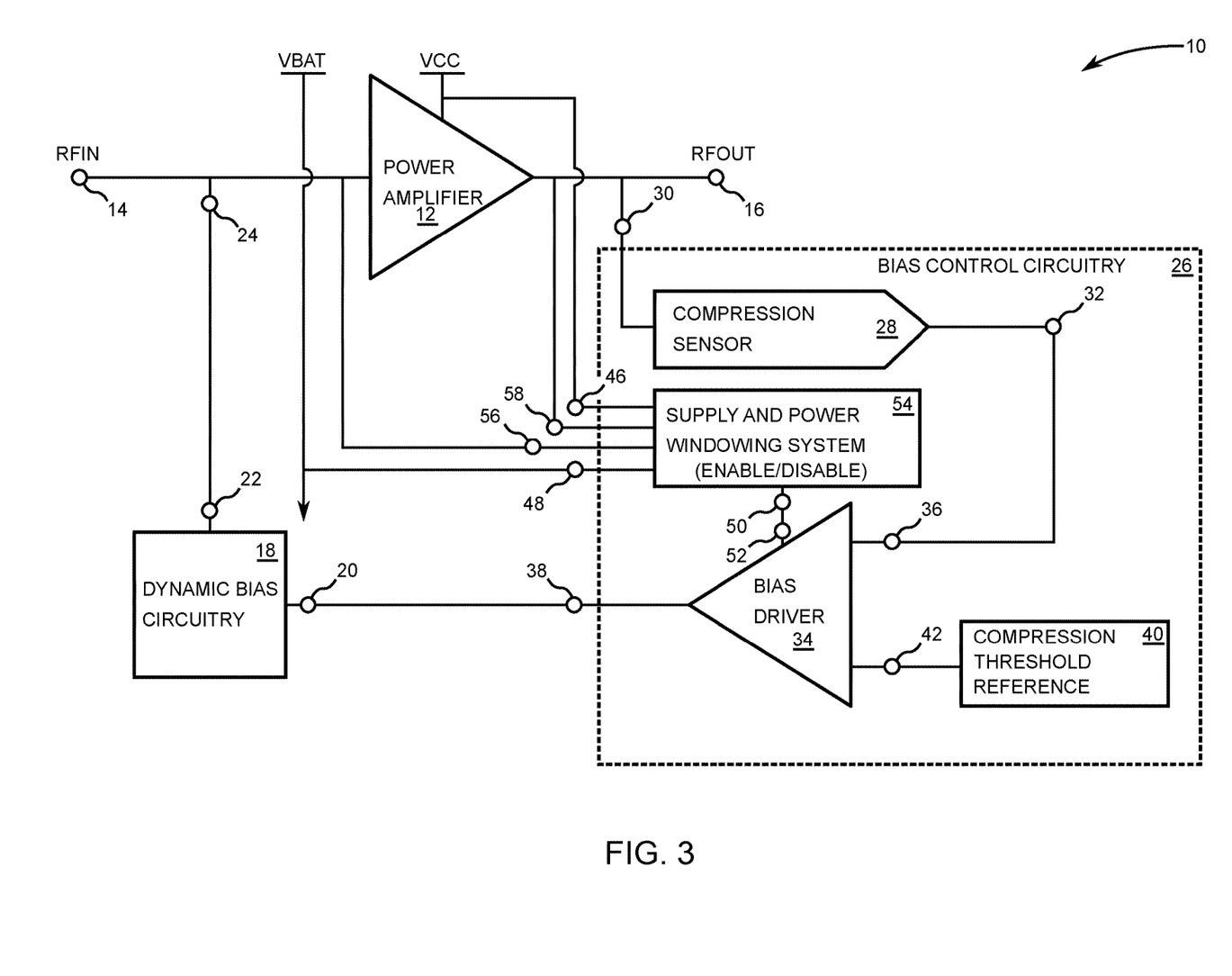
FIG. 3 is a block diagram of an exemplary embodiment of the power amplifier system in which the bias control circuitry further includes supply and power level windowing circuitry.

FIG. 3 is an exemplary embodiment of the power amplifier system 10 in which the bias control circuitry 26 further includes supply and power level windowing circuitry 54 having a first power input 56 coupled to the RF signal input 14 and a second power input 58. The power level windowing circuitry 54 is configured to enable the bias driver 34 when a supply level is above a first supply level or below a second higher supply level and to disable the bias driver 34 when the supply level is below the first supply level or above the second higher supply level. The supply and power windowing circuitry 54 is further configured to enable the bias driver 34 when an input power level is above a first input power level or below a second higher input power level and to disable the bias driver 34 when the output power level is below the first output power level or above the second higher output power level.

Figure 4:
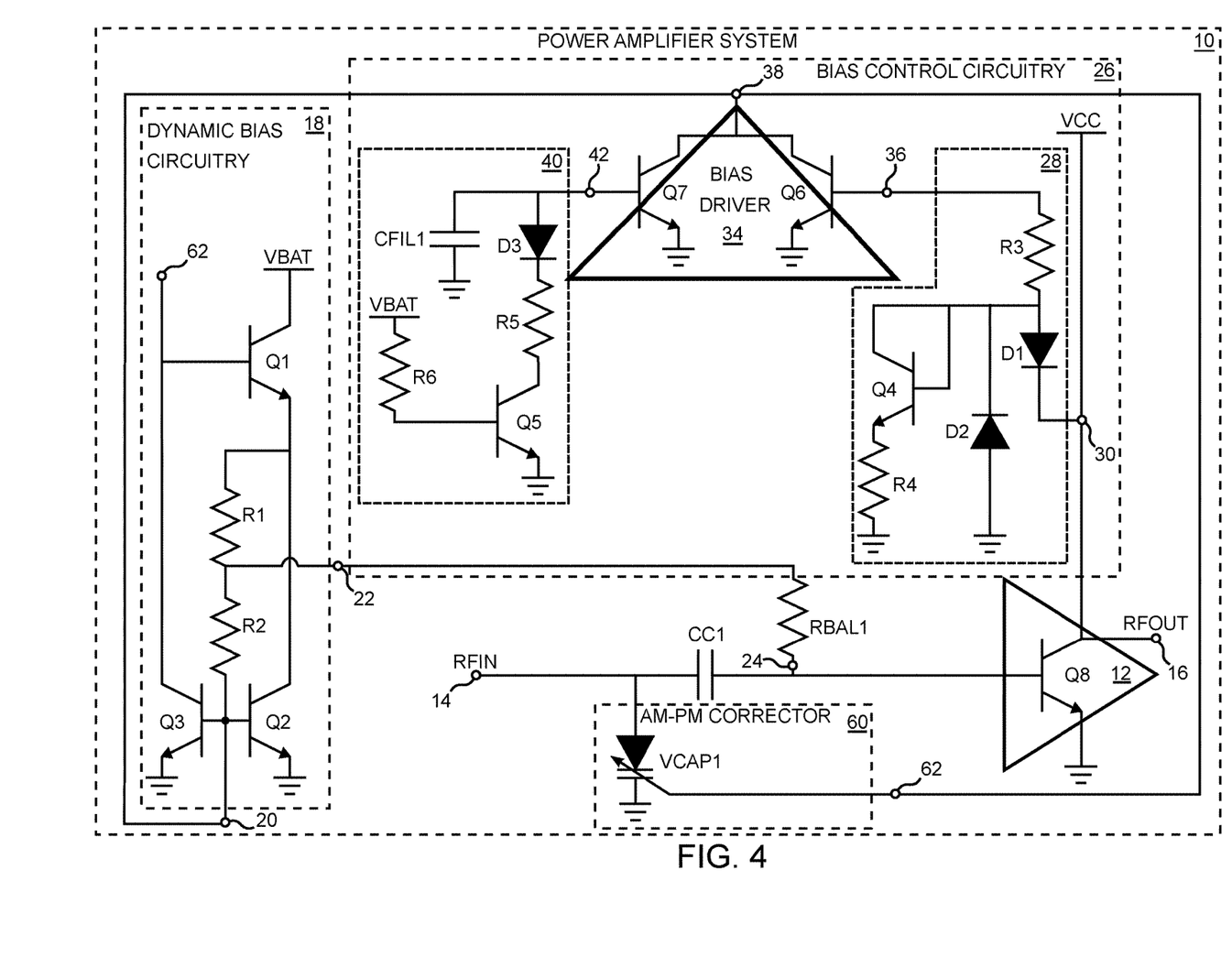
FIG. 4 is a block diagram of an exemplary embodiment of the power amplifier system showing exemplary dynamic bias circuitry and exemplary bias control circuitry with an additional amplitude-phase modulation corrector.

FIG. 4 is an exemplary embodiment of the power amplifier system 10 showing exemplary dynamic bias circuitry 18 and exemplary bias control circuitry 26 with additional exemplary amplitude-phase modulation corrector 60. The exemplary dynamic bias circuitry 18 includes a first bias transistor Q1 with an emitter coupled to a collector of a second transistor Q2 that has an emitter coupled to a fixed voltage node such as ground. The first bias transistor Q1 has a collector coupled to a voltage source such as VBAT. A third bias transistor Q3 has a base coupled to a base of the first bias transistor Q1 and constant bias voltage or constant current bias terminal 62. A base of the second bias transistor Q2 and a base of the third bias transistor Q3 are both coupled to the bias control input 20. A first resistor R1 and a second resistor R2 are coupled in series between the emitter of the first transistor Q1 and the bias control input 20. The bias output 22 is coupled to a node between the first resistor R1 and the second resistor R2. In this exemplary embodiment, a ballast resistor RBAL1 is coupled between the bias output 22 and the bias input 24.

The exemplary compression sensor 28 has a third resistor R3 coupled between the first driver input 36 and a collector of a fourth transistor Q4. A fourth resistor R4 is coupled between an emitter of the fourth transistor Q4 and the fixed voltage node, which in this example is ground. A base of the fourth transistor is coupled to the collector of the fourth transistor Q4. A first diode D1 has an anode coupled to the collector of the fourth transistor Q4 and a cathode coupled to the sensor input 30. A second diode D2 has a cathode coupled to the collector of the fourth transistor Q4 and an anode coupled to the fix voltage node, which is ground in this exemplary embodiment.

The compression threshold reference 40 has a filter capacitor CFIL1 coupled between the reference input 42 of the bias driver 34. A diode D3 has an anode coupled to the reference input 42 and a cathode coupled to a fifth resistor R5. A fifth transistor Q5 is coupled in series with the fifth resistor with a collector coupled to a fifth resistor and an emitter coupled to the fixed voltage node, which in this exemplary embodiment is ground. A sixth resistor R6 is coupled between a base of the fifth transistor Q5 and a voltage source such as VBAT.

In this exemplary embodiment, the bias driver 34 is configured as a comparator. A sixth transistor Q6 has a collector coupled to the driver output 38, an emitter coupled to the fixed voltage node, and a base coupled to the first driver input 36. A seventh transistor Q7 has a collector coupled the driver output 38, and an emitter coupled to the fixed voltage node, and a base coupled to the reference input 42. In this exemplary embodiment, the power amplifier stage 12 is depicted having a bipolar-junction power transistor Q8 having a collector coupled to the RF signal output 16, the sensor input 30, and a voltage source VCC.

The exemplary amplitude-phase modulation corrector 60 has a variable capacitance diode VCAP1 with a capacitance control terminal 62 coupled to the driver output 38. An anode of the variable capacitance diode VCAP1 is coupled to the RF signal input 14 and a cathode coupled the fixed voltage node, which in this exemplary embodiment is ground. A coupling capacitor CC1 coupled between the RF signal input 14 and the bias input 24 of the power amplifier stage 12 prevents bias generated by the dynamic bias circuitry 18 from passing through the variable capacitance diode VCAP1. In operation, the AM-PM corrector is configured to adjust capacitance of the variable capacitance diode VCAP1 to substantially maintain constant input capacitance of the power amplifier stage as the bias of the power amplifier stage 12 is adjusted by the bias control circuitry 26. In some embodiments, the bias control circuitry 26 is thermally coupled to the power amplifier stage 12 to improve temperature tracking.

Figure 5A:
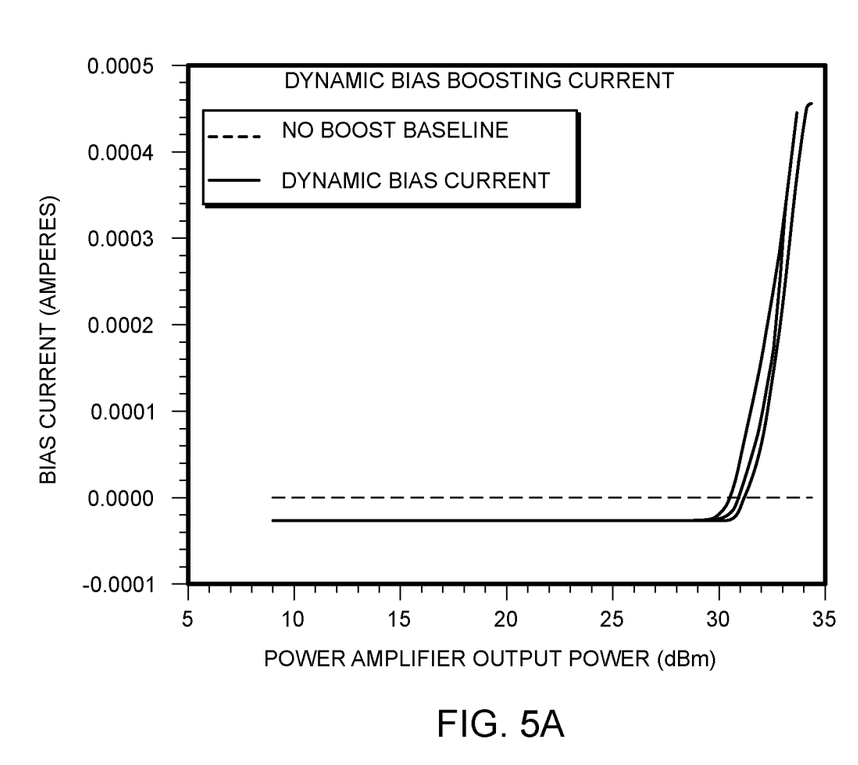
FIG. 5A is graph of dynamic bias boosting current of the present embodiments extending the linear region of power amplifier stage.
Figure 5B:
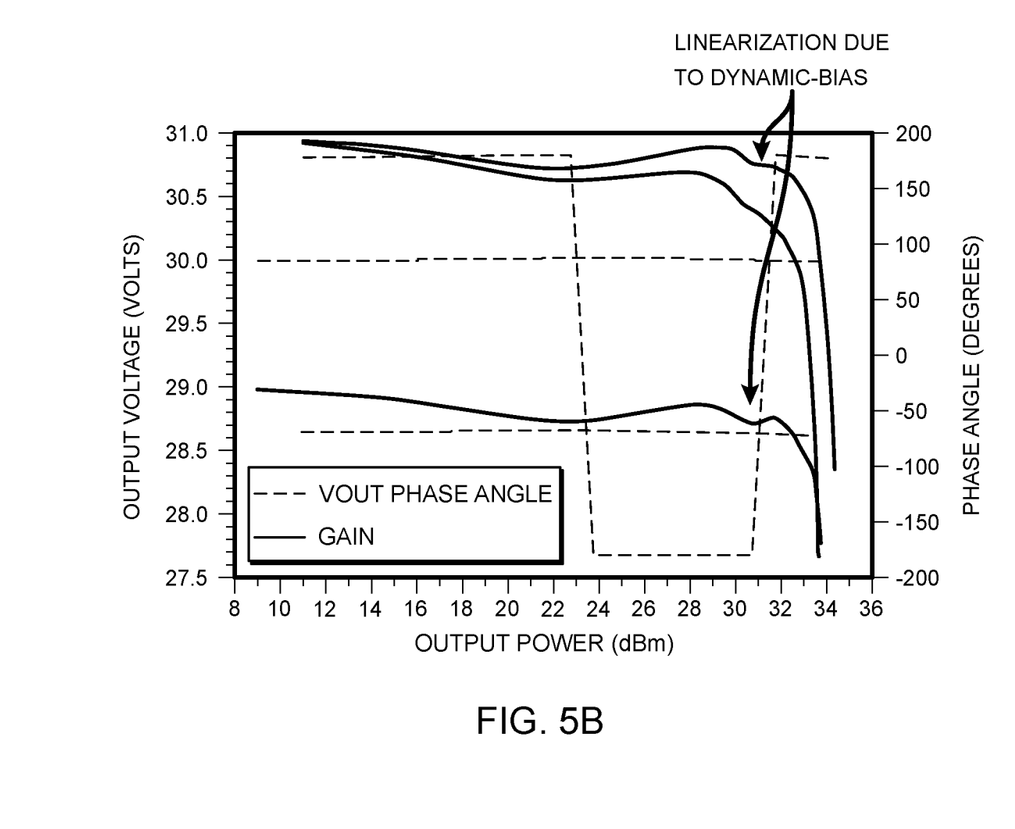
FIG. 5B is a graph depicting the extension of a soft compression region of an amplitude modulation-amplitude modulation curve.

FIG. 5A is graph of dynamic bias boosting current of the present embodiments extending the linear region of power amplifier stage 12 by extending the soft compression region of the amplitude modulation-amplitude modulation (AM-AM) curve depicted in FIG. 5B. The bias current injection for extending the linear region comes precisely when soft compression starts. The amount of dynamic bias boosting current to maintain a flat gain profile for the power amplifier stage 12 is provided by the dynamic bias circuitry 18 controlled by the bias control circuitry 26.

Figure 6A:
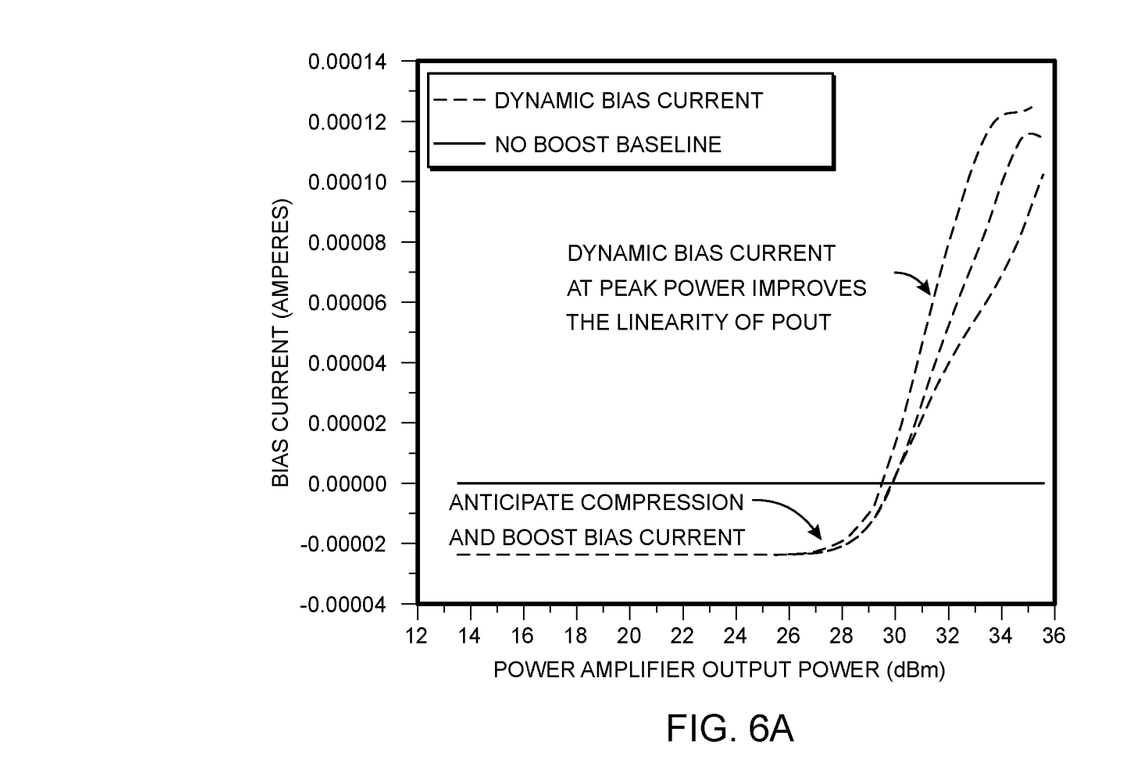
FIG. 6A is a graph of bias current versus output power in accordance with the present disclosure.
Figure 6B:
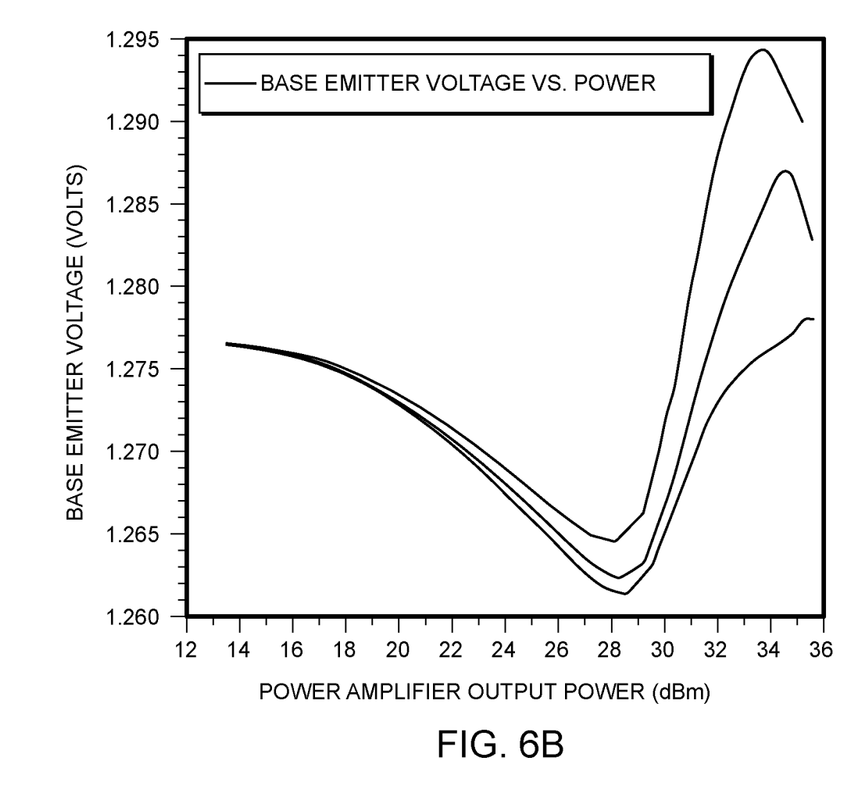
FIG. 6B is a graph showing an effect on base-to-emitter voltage versus output power due to dynamic boost biasing generated by the dynamic bias circuitry controlled by the bias control circuitry.

FIG. 6A is a graph of bias current versus output power in accordance with the present disclosure. In particular, the graph of FIG. 6A demonstrates that the dynamic bias circuitry 18 controlled by the bias control circuitry 26 in at least some embodiments may be configured to engage early in anticipation of compression. Moreover, the graph of FIG. 6A demonstrates that dynamic bias current generated by the dynamic bias circuitry 18 controlled by the bias control circuitry 26 improves the linearity of the output power when at peak output power. FIG. 6B is a graph showing an effect on base-to-emitter voltage versus output power due to dynamic boost biasing generated by the dynamic bias circuitry 18 controlled by the bias control circuitry 26.

Figure 7:
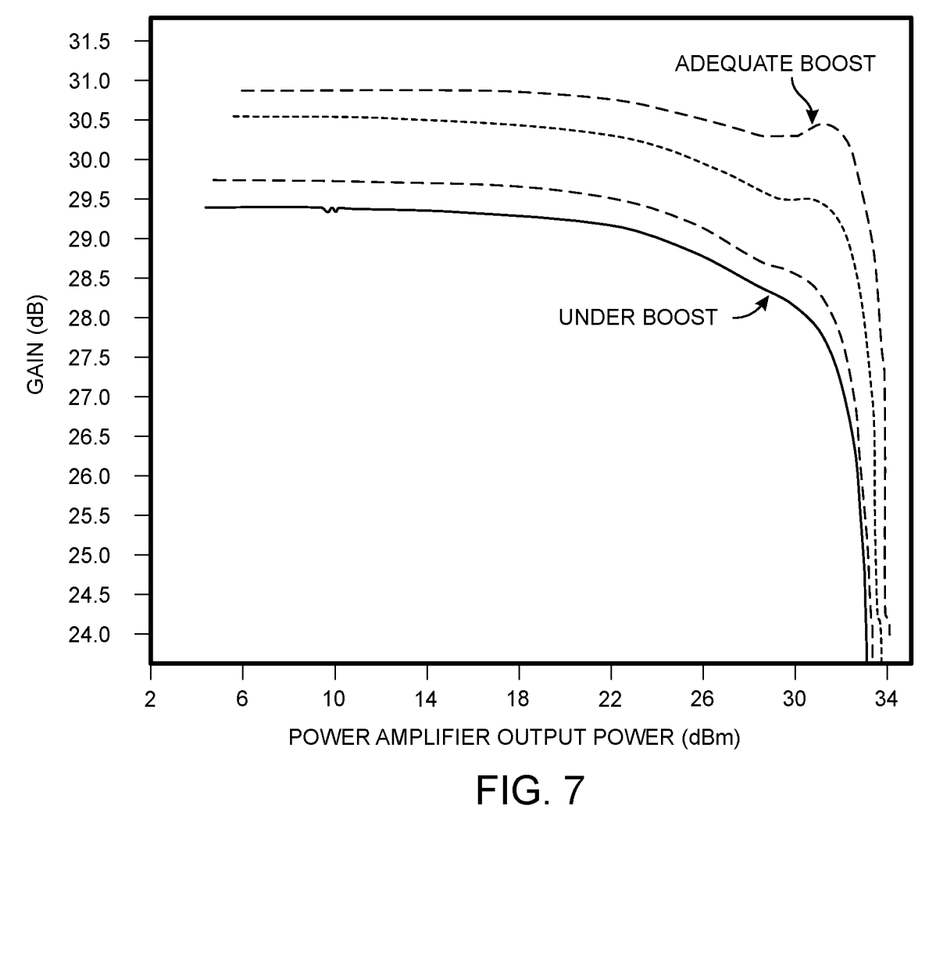
FIG. 7 is a graph showing the effects of varying dynamic bias boosting thresholds in accordance with the present disclosure.

FIG. 7 is a graph showing the effects of varying dynamic bias boosting thresholds in accordance with the present disclosure. In particular, the graph includes plots of gain versus output power for conditions ranging between under-boost and adequate-boost. The adequate-boost plot extends the flat gain profile of the power amplifier stage 12 from at least 6 dBm to at least 31 dBm where a small overshoot in gain occurs just before the power amplifier stage 12 enters hard compression due to low headroom for the supply voltage supplying power to the power amplifier stage 12.

Figure 8:
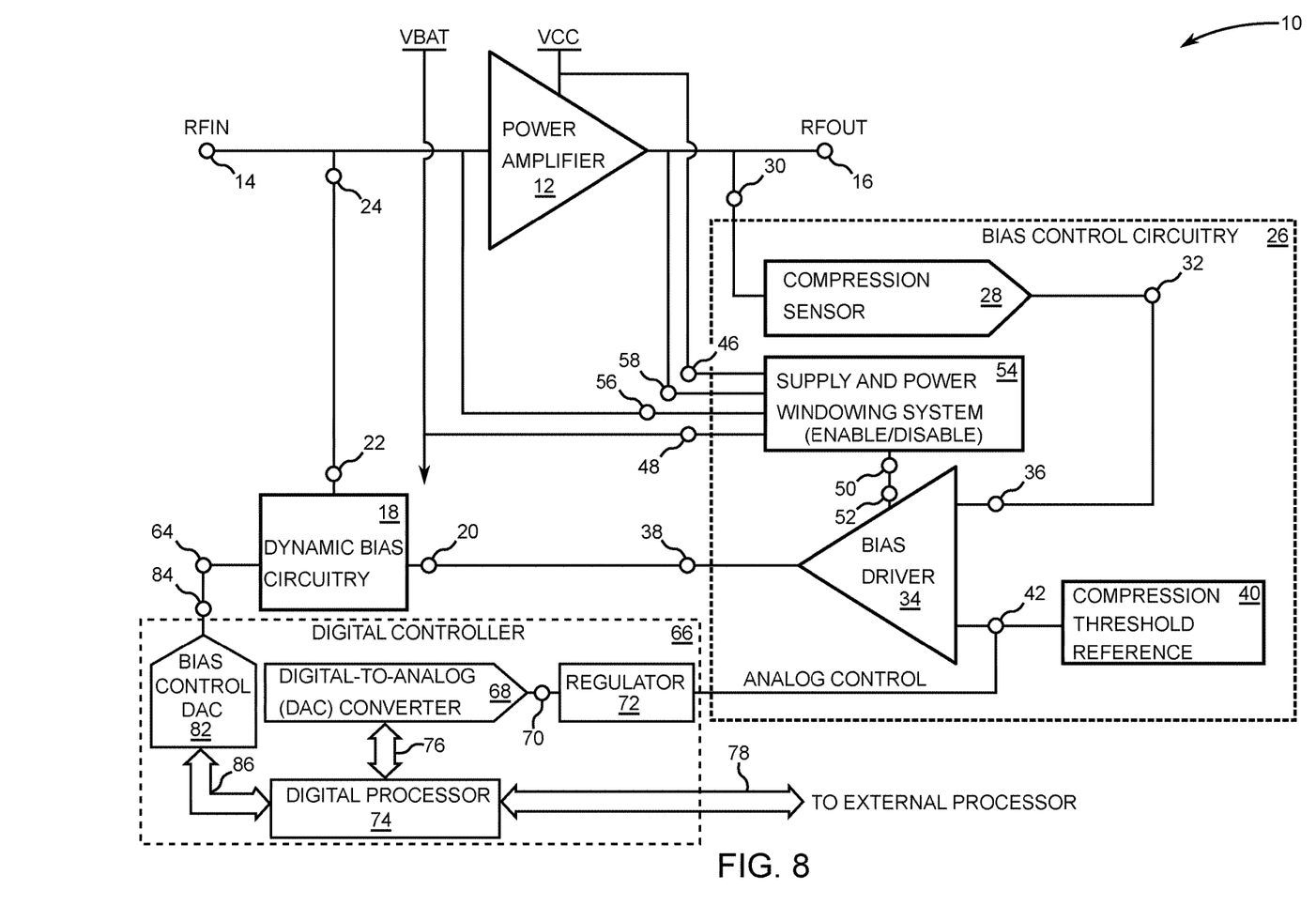
FIG. 8 is a block diagram of an exemplary embodiment of the power amplifier system further includes a digital controller that has a first digital-to-analog converter (DAC) having an analog output coupled to the reference input of the bias driver.

FIG. 8 is a block diagram of an exemplary embodiment of the power amplifier system 10 further includes a digital controller 66 that has a first digital-to-analog converter (DAC) 68 having an analog output 70 coupled to the reference input 42 of the bias driver 34. A regulator 72 may be coupled between the first DAC 68 and the reference input 42. The first DAC 68 provides an analog control signal that provides adjustment to the bias control circuitry 26. It is to be understood that the analog control signal could be applied to other control points within the bias control circuitry 26 such as the first driver input 36 of the bias driver 34.

The exemplary embodiment of the digital controller 66 also includes a digital processor 74 having a first internal communication bus 76 coupled to a digital input of the first DAC 68. The digital processor 74 is configured to drive the first DAC 68 in response to data received on an external communication bus 78. A second DAC 82 provides bias control to the dynamic bias circuitry 18 through a bias source output 84 that is coupled to a bias source terminal 64. A second internal bus 86 is coupled between the digital processor 74 and the second DAC 82. The digital processor 74 is further configured to drive the second DAC 82 in response to data received on the external communication bus 78.

Figure 9:
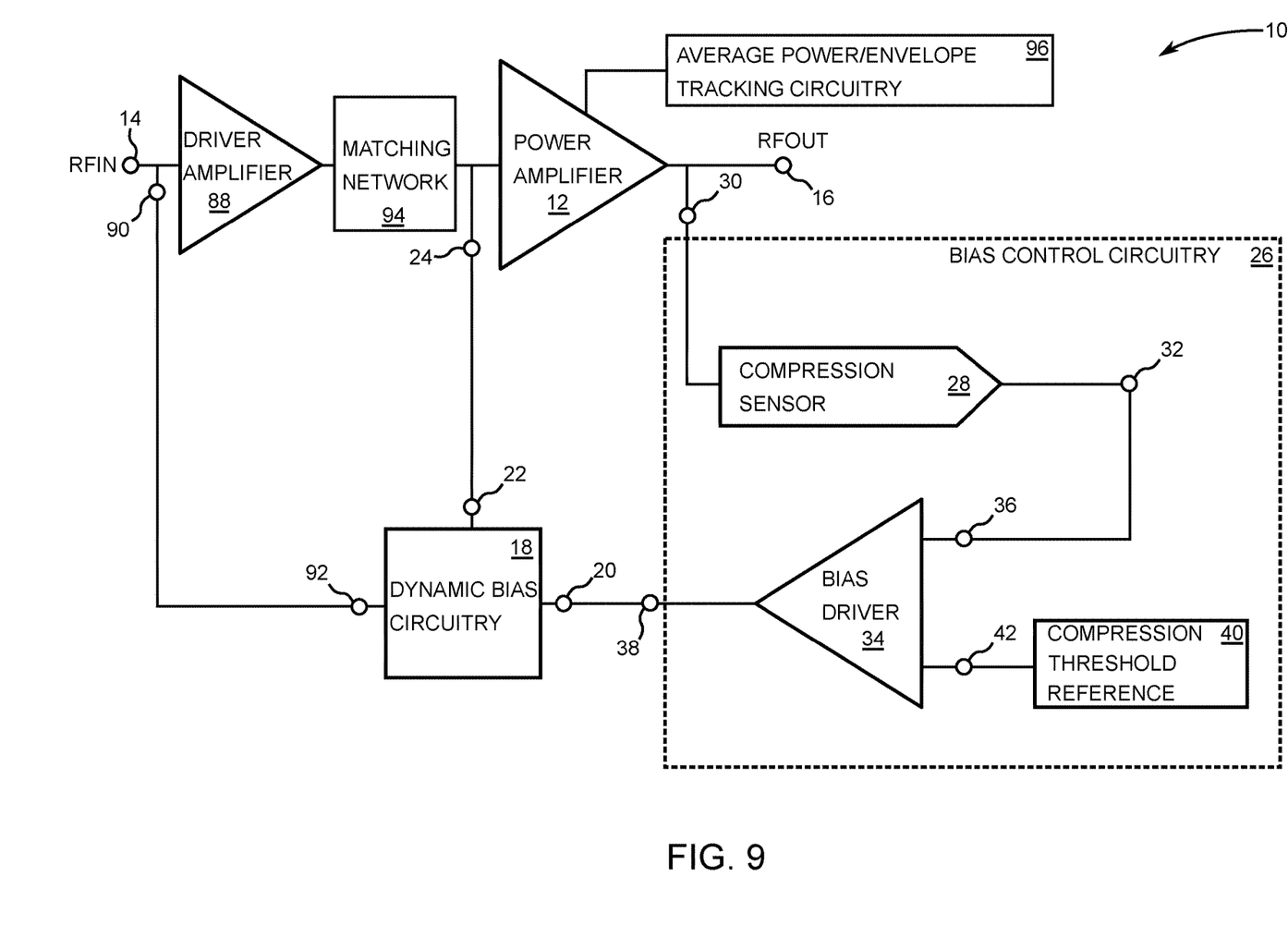
FIG. 9 is a block diagram of an exemplary embodiment of the power amplifier system further including a driver amplifier that has a driver bias input coupled to a second bias output of the dynamic bias circuitry.

FIG. 9 is a block diagram of an exemplary embodiment of the power amplifier system 10 further includes a driver amplifier 88 that has a driver bias input 90 coupled to a second bias output 92 of the dynamic bias circuitry 18. A matching network 94 is coupled between the driver amplifier 88 and the power amplifier 12. The matching network 94 is configured to match output impedance of the driver amplifier 88 to the input impedance of the power amplifier stage 12. The power amplifier system 10 further includes average power tracking and/or envelope tracking circuitry 96 that is configured to supply the power amplifier with a supply voltage that tracks either the average power of a signal at the RF signal input 14 or alternatively tracks the envelope of a signal at the RF input 14.

Figure 10:
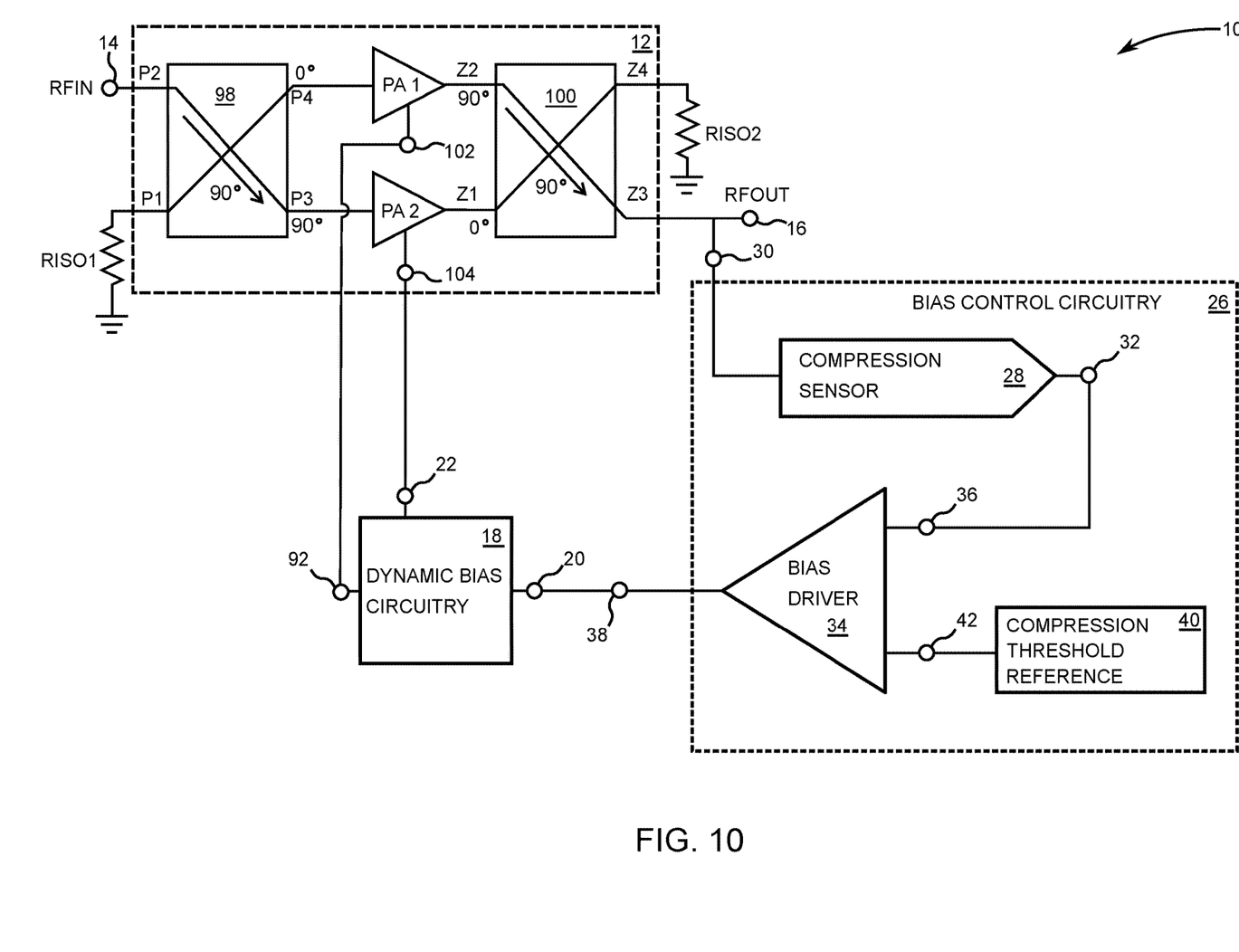
FIG. 10 is a block diagram of an exemplary embodiment of the power amplifier system in which the power amplifier stage is a quadrature amplifier.

FIG. 10 is a block diagram of an exemplary embodiment of the power amplifier system 10 in which the power amplifier stage 12 is a quadrature amplifier, and in this exemplary embodiment the power amplifier stage 12 is a Doherty amplifier. In this case, the power amplifier stage 12 includes a first quadrature coupler 98 having a first port P1 that is configured as an isolation port. A first isolation resistor RSIO1 is coupled between the first port P1 and a fixed voltage node such as ground. A second port P2 is coupled to the RF signal input 14 and is further coupled to a third port P3. An RF signal passing between P1 and the third port P3 undergoes approximately 90 degrees of phase shift. A fourth port P4 is coupled to the first port P1. The RF signal when passing between the first port P1 and the fourth port P4 undergoes approximately zero degrees of phase shift.

A second quadrature coupler 100 has a first port Z1, a second port Z2, a third port Z3, and a fourth port Z4. In this exemplary embodiment, a second isolation resistor RS102 is coupled between the fourth port Z4 and the fixed voltage node such as ground. The fourth port Z4 is coupled to the first port Z1. The RF signal when passing between the first port Z1 and the fourth port P4 undergoes approximately zero degrees of phase shift. The second port Z2 is coupled to the third port Z3. The RF signal when passing between the second port Z2 and the third port P3 undergoes approximately ninety degrees of phase shift. The third port Z3 is also coupled to the RF signal output 16. Both the first quadrature coupler and the second quadrature coupler may be Lange-type couplers.

A carrier amplifier PA1 is coupled between the fourth port P4 of the first quadrature coupler 98 and the second port Z2 of the second quadrature coupler 100. The carrier amplifier PA1 has a first dynamic bias input 102 coupled to the second bias output 92 of the dynamic bias circuitry 18. A peaking amplifier PA2 is coupled between the third port P3 of the first quadrature coupler 98 and the first port Z1 of second quadrature coupler 100. The peaking amplifier PA2 has a second dynamic bias input 104 coupled to the bias output 22 of the dynamic bias circuitry 18.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
    a power amplifier stage having a radio frequency (RF) signal input and an RF signal output;
    dynamic bias circuitry having a bias control input and a bias output, wherein the bias output is coupled to a bias input of the power amplifier stage; and
    bias control circuitry comprising:
        a compression sensor having a sensor input coupled to the RF signal output and a sensor output, wherein the compression sensor is configured to generate a gain deviation signal in response to a sensed deviation from a flat gain profile of the power amplifier stage;
        a bias driver having a driver input coupled to the sensor output and a driver output coupled to the bias control input, wherein the bias driver is configured to generate a bias adjust signal to drive the dynamic bias circuitry to adjust bias of the power amplifier stage to maintain the flat gain profile in response to the gain deviation signal; and
        power windowing circuitry that is configured to enable the bias driver and disable the bias driver in response to power level.

2. The power amplifier system of claim 1 wherein the bias control circuitry further includes a compression threshold reference configured to generate a reference signal that scales the bias adjust signal that is received by a reference input of the bias driver.

3. The power amplifier system of claim 2 wherein the bias driver is a comparator that is configured to compare the gain deviation signal to the reference signal and generate the bias adjust signal in proportion to a difference between the gain deviation signal and the reference signal.

4. The power amplifier system of claim 1 wherein the bias control circuitry further includes supply windowing circuitry that is configured to enable the bias driver when a supply level is above a first supply level or below a second higher supply level and to disable the bias driver when the supply level is below the first supply level or above the second higher supply level.

5. The power amplifier system of claim 1 wherein the power windowing circuitry is configured to enable the bias driver when the power level is an input power level that is above a first input power level or below a second higher input power level and to disable the bias driver when the input power level is below the first input power level or above the second higher input power level.

6. The power amplifier system of claim 1 wherein the power windowing circuitry is configured to enable the bias driver when the power level is an output power level that is above a first output power level or below a second higher output power level and to disable the bias driver when the output power level is below the first output power level or above the second higher output power level.

7. The power amplifier system of claim 1 wherein the power windowing circuitry is configured to:
    enable the bias driver when the power level is an input power level that is above a first input power level or below a second higher input power level and to disable the bias driver when the input power level is below the first input power level or above the second higher input power level; and
    enable the bias driver when the power level is an output power level that is above a first output power level or below a second higher output power level and to disable the bias driver when the output power level is below the first output power level or above the second higher output power level.

8. The power amplifier system of claim 1 wherein the bias control circuitry further comprises supply windowing circuitry that is configured to:
    enable the bias driver when a supply level is above a first supply level or below a second higher supply level and to disable the bias driver when the supply level is below the first supply level or above the second higher supply level; and
    the power windowing circuitry configured to:
    enable the bias driver when the power level is an input power level that is above a first input power level or below a second higher input power level and to disable the bias driver when the input power level is below the first input power level or above the second higher input power level.

9. The power amplifier system of claim 1 wherein the bias control circuitry further comprises supply windowing circuitry that is configured to:

enable the bias driver when a supply level is above a first supply level or below a second higher supply level and to disable the bias driver when the supply level is below the first supply level or above the second higher supply level; and the power windowing circuitry is configured to:

enable the bias driver when the power level is an output power level that is above a first output power level or below a second higher output power level and to disable the bias driver when the output power level is below the first output power level or above the second higher output power level.

10. The power amplifier system of claim 1 wherein the bias control circuitry further comprises supply windowing circuitry that is configured to:

enable the bias driver when a supply level is above a first supply level or below a second higher supply level and disable the bias driver when the supply level is below the first supply level or above the second higher supply level; and the power windowing circuitry is configured to:

enable the bias driver when the power level is an input power level that is above a first input power level or below a second higher input power level and disable the bias driver when the input power level is below the first input power level or above the second higher input power level; and enable the bias driver when the power level is an output power level that is above a first output power level or below a second higher output power level and disable the bias driver when the output power level is below the first output power level or above the second higher output power level.

11. The power amplifier system of claim 1 wherein the power amplifier stage comprises at least one bipolar transistor configured to generate an amplified version of an RF signal received at the RF input.

12. The power amplifier system of claim 1 wherein the power amplifier stage comprises at least one field-effect transistor configured to generate an amplified version of an RF signal received at the RF input.

13. The power amplifier system of claim 1 wherein the power amplifier stage comprises a single-ended amplifier.

14. The power amplifier system of claim 1 wherein the power amplifier stage comprises a differential amplifier.

15. The power amplifier system of claim 1 wherein the power amplifier stage comprises a quadrature amplifier.

16. The power amplifier system of claim 15 wherein the quadrature amplifier is a Doherty amplifier.

17. A power amplifier system comprising:
a power amplifier stage having a radio frequency (RF) signal input and an RF signal output;
dynamic bias circuitry having a bias control input and a bias output, wherein the bias output is coupled to a bias input of the power amplifier stage; and
bias control circuitry comprising:
a compression sensor having a sensor input coupled to the RF signal output and a sensor output, wherein the compression sensor is configured to generate a gain deviation signal in response to a sensed deviation from a flat gain profile of the power amplifier stage;
a bias driver having a driver input coupled to the sensor output and a driver output coupled to the bias control input, wherein the bias driver is configured to generate a bias adjust signal to drive the dynamic bias circuitry to adjust bias of the power amplifier stage to maintain the flat gain profile in response to the gain deviation signal; and
a digital controller comprising:
a digital-to-analog converter (DAC) having an analog output coupled to an input of the bias driver; and
a digital processor having an internal communication bus coupled to a digital input of the DAC and an external communication bus, wherein the digital processor is configured to drive the DAC in response to data received on the external communication bus.

18. A power amplifier system comprising;
a power amplifier stage having a radio frequency (RF) signal input and an RF signal output;
an amplifier driver stage having a driver signal output coupled to the RF signal input of the power amplifier stage;
dynamic bias circuitry having a bias control input and a bias output, wherein the bias output is coupled to a bias input of the amplifier driver stage; and
bias control circuitry comprising:
a compression sensor having a sensor input coupled to the RF signal output and a sensor output, wherein the compression sensor is configured to generate a gain deviation signal in response to a sensed deviation from a flat gain profile of the power amplifier stage; and
a bias driver having a driver input coupled to the sensor output and a driver output coupled to the bias control input, wherein the bias driver is configured to generate a bias adjust signal to drive the dynamic bias circuitry to adjust bias of the power amplifier stage to maintain the flat gain profile in response to the gain deviation signal.

19. The power amplifier system of claim 18 wherein the power amplifier stage is supplied power through envelope tracking circuitry.

20. A power amplifier system comprising;
a power amplifier stage having a radio frequency (RF) signal input and an RF signal output;
dynamic bias circuitry having a bias control input and a bias output, wherein the bias output is coupled to a bias input of the power amplifier stage; and
bias control circuitry comprising:
a compression sensor having a sensor input coupled to the RF signal output and a sensor output, wherein the compression sensor is configured to generate a gain deviation signal in response to a sensed deviation from a flat gain profile of the power amplifier stage;
a bias driver having a driver input coupled to the sensor output and a driver output coupled to the bias control input, wherein the bias driver is configured to generate a bias adjust signal to drive the dynamic bias circuitry to adjust bias of the power amplifier stage to maintain the flat gain profile in response to the gain deviation signal; and
an amplitude modulation-phase modulation (AM-PM) corrector having a variable capacitance diode coupled between the RF signal input of the power amplifier stage and a fixed voltage node, wherein the AM-PM corrector is configured to adjust capacitance of the variable capacitance diode to substantially maintain constant input capacitance of the power amplifier stage as the bias of the power amplifier is adjusted by the bias control circuitry.

* * * * *